United States Patent [19] [11] 3,850,634
Steele et al. [45] Nov. 26, 1974

[54] METHOD OF FORMING A PHOTORESIST WITH ACRYLAMIDE PHOTOPOLYMERS

[75] Inventors: Fred W. Steele; Joseph L. Sannella, both of Muncie, Ind.

[73] Assignee: Ball Corporation, Muncie, Ind.

[22] Filed: July 19, 1973

[21] Appl. No.: 380,789

[52] U.S. Cl. .................. 96/35.1, 96/36.3, 96/86 P, 96/115 R, 96/115 P
[51] Int. Cl. .............................................. G03c 1/70
[58] Field of Search ............. 96/35.1, 115 P, 115 R; 204/159.14, 159.23

[56] References Cited

UNITED STATES PATENTS 3,549,367 12/1970 Chang et al. .................. 96/115 P X
3,725,231 4/1973 Jahnke .......................... 96/115 P X

*Primary Examiner*—Ronald H. Smith
*Attorney, Agent, or Firm*—Gilbert E. Alberding

[57] ABSTRACT

The subject invention relates to a method of making a photoresist by forming a polymerizable layer in a substrate, said layer comprising N-3-oxohydrocarbon-substituted acrylamide or a partial condensate of the N-3-oxohydrocarbonsubstituted acrylamide, an organic solvent and a photoinitator, evaporating the solvent therefrom to leave a film upon said substrate, exposing the film to actinic light to effect cross-linking in the areas of exposure, and thereafter developing the film to remove the non-exposed portion therefrom to form the photoresist.

5 Claims, No Drawings

METHOD OF FORMING A PHOTORESIST WITH ACRYLAMIDE PHOTOPOLYMERS

BACKGROUND OF THE INVENTION

This invention relates to a novel method for forming photopolymer printing plates. More specifically, it relates to such plates which have a thin photopolymerizable layer on a generally flexible support.

Photopolymer printing plates are well-known in the industry for printing various materials. Such printing plates are obtained by exposing imagewise the plate having a photopolymerizable layer comprising a polymerizable monomer and a suitable photoinitator. Upon exposure to actinic radiation the photoinitator becomes activated in the exposed areas and induces the polymerization of the monomers. As a consequence, the exposed plate comprises areas of polymerized and unpolymerized portions in imagewise distribution corresponding to the light and dark areas, respectively, of the master negative used in the exposure. These exposed plates may be utilized in a number of conventional ways known to the industry. One important application is in letterpress printing. In letterpress printing a relief-image having raised areas of which are linked and pressed against a suitable surface, e.g., a sheet of paper, thus giving a print. For such applications a number of printing plates having various polymer compositions are known in the art and furnish a print quality of good order and have a press life comparable to the more expensive metal plates.

SUMMARY OF THE INVENTION

A object of this invention is to provide a novel method for forming a photoresist member.

Another object is to provide a method and compositions which are capable of being converted through actinic light into tough shaped articles.

Another object is to provide a method and compositions which can be readily coated on supporting surfaces in making printing plates.

A further object is to provide an inexpensive method for preparing a substrate capable of being photopolymerized in imagewise configuration and thereafter readily developed through inexpensive means.

Still other objects will be apparent from the following description of the invention.

Briefly, the instant invention is addressed to a method of making a photoresist by forming a polymerizable layer on a substrate, said layer comprising N-3-oxohydrocarbon-substituted acrylamide or a partial condensate of the N-3-oxohydrocarbon-substituted acrylamide, an organic solvent, and a photoinitator, evaporating the solvent therefrom to leave a film upon said substrate, exposing the film to actinic light to effect cross-linking in the areas of exposure, and thereafter developing the film to remove the non-exposed portions therefrom to form the photoresist.

The acrylamides herein referred to are the monomeric N-3-oxohydrocarbon-substituted acrylamides having the general formula:

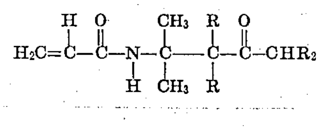

wherein R is a hydrogen atom, a lower alkyl radical, or a methylol group. Thus, the above-formula embraces such monomeric compounds such as N-(1,1-dimethyl-3-oxobutyl)-acrylamide, N-(1,1-dimethyl-2,2-dimethylol-3-oxobutyl)-acrylamide, N-(1,1-dimethyl-2,2-dimethylol-3-oxo-4,4-dimethylolbutyl)acrylamide and the like. Also, embraced within the preferred acrylamides are those that are referred to as the partial condensates of the acrylamides having pendent methylol groups and include N-(1,1-dimethyl-2,2-dimethylol-3-oxobutyl)acrylamide. It has been found that those partial condensates of said acrylamides that have an average molecular weight of between about 1000 and 3000 produce suitable photoresist plates in accordance with this invention.

Although a number of organic solvents may be advantageously employed in accordance with this invention, it has been found that mixtures of ethylene glycol monoethyl ether acetate and methylene chloride produce very satisfactory results. Generally, a 75 percent mixture of the acetate to about 25 percent methylene chloride has been found most advantageous.

The forming of a film or coating upon a suitable substrate may be done by numerous conventional means well known in the art. Spraying, dipping, brushing, blowing and doctoring are all workable. When dealing with small plates the solution may be whirled upon the substrate to a desired thickness. Also, when treating larger substrates it is generally found advantageous to brush the coating over the surface by various conventional applicator means known to the art. The thickness of the coating may vary over considerable range. However, it has been found that thicknesses from 0.05 mils to 25 mils offer the best photoresist plate material.

A number of photoinitators may be utilized to carry out the herein disclosed method, and include 4,4'-bis(dimethylamino) benzophenone, 4,4'-bis(diethylamino) benzophenone, 2-benzoylmethylene-1-methyl-B-naphthathiazoline, and the like. Although there is no particular order in mixing the various compounds to form the coating or film-forming composition herein, it is usually best to add the photoinitator prior to its application on a given substrate.

The removal of solvent may be done by conventional means well known in the art. By raising the temperature of the substrate a number of degrees the solvent may be readily removed therefrom and vented from the vicinity of the working area.

When the film is dry or substantially dry a master negative may be placed thereover and thereafter subjected to ultraviolet light. The compounds herein may be exposed to actinic light from any source and of any type. The light source should furnish an effective amount of ultraviolet radiation. Suitable sources of such radiation include carbon arcs, mercury vapor lampss, fluorescent lamps, argon glow lamps, photographic flood lamps, and tungsten lamps.

The substrate used in accordance with this invention include aluminum, copper, magnesium, zinc, alloys thereof, and other similar materials.

The development of the image may be readily accomplished, such as by washing the photoresist plates with slightly acidic solutions. By such treatment, the unexposed areas of the coating are washed away from the substrate leaving in relief the polymerized areas in accordance with the master configuration.

The following examples are given to illustrate the invention and are not intended to limit it in any manner. All parts are given in parts by weight unless otherwise expressed.

EXAMPLE 1

In a 500 ml., flask 10 gm, of N-(1,1-dimethyl-2,2-dimethylol-3-oxobutyl)-acrylamide was dissolved in a mixture of 150 ml., of ethylene glycol monomethyl ether acetate and 50 ml., of methylene chloride to which was added 2 gm., of 4,4[1]-bis (dimethylamino) benzophenone. A clear solution resulted in 5 ml., thereof were placed in the center of six zinc plates and whirled at 90 r.p.m. for about 3 minutes at room temperature. The plates were thereafter gently warmed to about 40°C., for about 2 minutes. The film was about 0.1 mils. in thickness and was relatively uniform throughout the plate. Over the dried coating was placed a master negative and thereafter subjected to ultraviolet light for about 2 minutes. After exposure, each plate was washed thoroughly with water for several minutes and finally baked at 150°C., for 15 minutes. The plates were thoroughly developed by treating with a one percent acidic acid solution and were thereafter etched by a 15 percent nitric acid solution for about 5 minutes. An excellent reproduction of the negative was observed and the resist material adhered well to the metal surface. Printing ink was applied over the resist areas and the ink was noted to be readily taken up by these areas.

EXAMPLE 2

In a 500 ml., flask 10 gm., of the partial condensate of N-(1,1-dimethyl-3-oxobutyl)-acrylamide was dissolved in a mixture of 170 ml., ethylene glycol monoethyl ether acetate and 30 mls., of methylene chloride along with 2 gms., of 4,4[1]-bis(dimethylamino) benzophenone. This solution (about 5 mls., thereof) was whirled on two 8 × 10 inch zinc plates for about 2 minutes at room temperature at about 90 r.p.m., until the coating was just dry to the touch. After placing a master negative over the surface it was exposed to ultraviolet light for about 2½ minutes and finally baked at 150°C., for 10 minutes. The plates were treated with a 1 percent aqueous acidic acid solution and were thereafter etched by a 10 percent nitric acid solution for about 13 minutes. The photoresist adhered well to the zinc surface. An excellent reproduction of the master negative was noted.

The invention has been described in detail with particular reference to preferred embodiments thereof, but it will be understood that variations and modifications can be effected within the scope and spirit of the invention as described herein above and as defined in the appended claims.

What is claimed is:

1. A method of forming a photoresist comprising forming on a substrate a coating comprising an acrylamide selected from the group consisting of N-3-oxohydrocarbon-substituted acrylamide having the general formula:

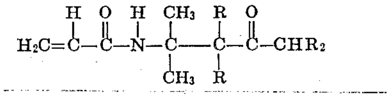

wherein R is hydrogen, methylol, or a lower alkyl radical, and a partial condensate of said N-3-oxohydrocarbon-substituted acrylamide, a solvent comprising a mixture of ethylene glocol monomethyl ether acetate and methylene chloride, and a photoinitator, evaporating the solvent therefrom to leave a dry film upon said surface, exposing the film to ultraviolet light to effect crosslinking in the area of exposure, and developing the film to remove the non-exposed portions therefrom to form the photoresist.

2. The method of claim 1 wherein the N-3-oxohydrocarbon-substituted acrylamide is N-(1,1-dimethyl-3-oxobutyl)- acrylamide.

3. The method of claim 1 wherein the partial condensate of the N-3-oxohydrocarbon-substituted acrylamide has an average molecular weight of about 1500.

4. The method of claim 1 wherein the photoinitator is 4,4[1]-bis (dimethylamino)benzophenone or 4,4[1]-bis (diethylamino) benzophenone.

5. The method of claim 1 wherein the metal coated is zinc, magnesium, aluminum or copper.

* * * * *